United States Patent [19]

Temple

[11] 4,261,000

[45] Apr. 7, 1981

[54] HIGH VOLTAGE SEMICONDUCTOR DEVICE HAVING AN IMPROVED DV/DT CAPABILITY

[75] Inventor: Victor A. K. Temple, Jonesville, N.Y.

[73] Assignee: General Electric Company, Schenectady, N.Y.

[21] Appl. No.: 152,770

[22] Filed: May 23, 1980

[51] Int. Cl.³ .............................................. H01L 29/74
[52] U.S. Cl. ...................................... 357/38; 357/55; 357/86
[58] Field of Search .............................. 357/38, 55, 86

[56] References Cited

U.S. PATENT DOCUMENTS

| 3,794,890 | 2/1974 | Weimann et al. ...................... 357/38 |
| 3,967,294 | 6/1976 | Takase et al. ......................... 357/38 |
| 4,110,638 | 8/1978 | Voss ...................................... 357/38 |
| 4,208,669 | 6/1980 | Silber et al. .......................... 357/38 |

FOREIGN PATENT DOCUMENTS 2610828  10/1976  Fed. Rep. of Germany .............. 357/38

OTHER PUBLICATIONS

Silber et al., "Improved Gate Concept for Urgent Activated Power Thyristors," IEEE Int'l Dev. Meeting, 1975, #16.4, pp. 371-374.

*Primary Examiner*—Joseph E. Clawson, Jr.
*Attorney, Agent, or Firm*—Nathan D. Herkamp; James C. Davis, Jr.; Paul R. Webb, II

[57] ABSTRACT

A semiconductor device used for high voltage applications exhibits reduced susceptibility to being inadvertently turned-on by capacitive charging currents generated by relatively high voltage transients impressed across an anode and a cathode of the device. The capacitive charging currents are manifested as a gate current which in a thyristor renders the device conductive if it exceeds a critical value and in a transistor is multiplied by the current gain. A conductive ring and adjacent groove are employed on the surface of the device, along with certain interconnections, to maintain the level of the transient-produced gate current at a value below the critical value.

7 Claims, 4 Drawing Figures

HIGH VOLTAGE SEMICONDUCTOR DEVICE HAVING AN IMPROVED DV/DT CAPABILITY

RELATED APPLICATIONS

This application is related to V.A.K. Temple application Ser. No. (Docket RD-8916) filed concurrently herewith, and to V.A.K. Temple application Ser. No. (Docket RD-8654) filed concurrently herewith, both of which are assigned to the instant assignee.

BACKGROUND OF THE INVENTION

This invention relates to semiconductor switching devices, and more particularly, to high voltage semiconductor switching devices having reduced susceptibility to inadvertent device turn-on due to high voltage transients.

Thyristors, amplifying gate thyristors, triacs and transistors are semiconductor devices often used to turn-on and turn-off high voltage sources. These devices include at least first and second main current carrying electrodes and a gate electrode. A main voltage is applied across the first and second electrodes such that a main current flows therebetween upon application of a control signal to the gate electrode. The device is said to be in a turned-on state when conduction current flows between the first and second electrodes. Because the device has an internal junction capacitance, its forward-blocking capability is sensitive to the rate at which a forward voltage is applied to its main terminals. A steep rising voltage impressed across the main terminals may cause a capacitive charging current to flow through the device. The charging current ($i = C_j dv/dt$) is a function of the inherent junction capacitive value and the rate of rise of the impressed voltage. If the rate of rise of impressed voltage exceeds a critical value, the capacitive charging current may be large enough to generate a gate current at a sufficient level and for a sufficient time to turn on the device. The ability of the device to withstand an impressed voltage transient across its main terminals is commonly termed the dv/dt capability specified in volts/microsecond. The dv/dt capability becomes of particular importance when voltage transients are impressed across the main terminals of the device. Voltage transients occur in electrical systems when some disturbance disrupts the normal operation of the system or even in normal circuit operation when other devices in the system switch on or off. Voltage transients generally have a fast rate of rise that may be greater than the dv/dt capability of the device. If the rate of rise of the transient exceeds the dv/dt capability of the thyristor, for example, it may cause the device to be inadvertently turned-on.

There are a number of known methods for increasing the dv/dt capability of the semiconductor device. One such method is the use of "emitter shorts" in a relatively large emitter area of a semiconductor device. Disadvantages that may occur with the use of emitter shorts are that the gate current required to activate the semiconductor device is increased and the di/dt rating of the device is also decreased.

Another known method of improving the dv/dt capability of the semiconductor device is the use of interdigitation. Interdigitation increases the initial turn-on area of the emitters and correspondingly reduces the turn-on sensitivity of the device to gate current. The interdigitation approach raises problems related to packaging as well as increasing gate current requirements.

A still further known method of increasing the dv/dt capability of the semiconductor device is the use of a resistor connected between the gate and the cathode of the semiconductor device, which provides a shunt path to divert a portion of the transient generated gate current away from the emitter of the cathode. The use of a resistive shunt path for the gate signal reduces the gate sensitivity of the semiconductor device as well.

The present invention concerns a high voltage semiconductor device in which the dv/dt capability of the device is increased by decreasing the amount of the transient capacitive charging currents conducted to the emitters of the device.

One object of the present invention is to provide a semiconductor device in which means are incorporated for increasing its dv/dt rating.

Another object of the present invention is to provide an improvement to the dv/dt rating of the semiconductor device without causing degradation of the other parameters of the device.

These and other objects of the invention will become apparent to those skilled in the art upon consideration of the following description of the invention.

SUMMARY OF THE INVENTION

In accordance with one preferred embodiment of the invention, a high voltage semiconductor device comprises at least first and second cathodes, a collective gate region and an anode. The collective gate region adjoins the first cathode, and includes a first gate region adjacent to the first cathode, and a second gate region separated from the first gate region and the first cathode by an isolation region. The first gate region is adapted to receive an applied signal. The second gate region is connected to the second cathode by a conductive element. Each of the first and second cathodes, respectively, having an emitter layer affixed beneath an electrode, respectively, is separated from the anode by at least a first and second layer of alternating conductivity-type material. The second cathode and the anode are adapted to be coupled between opposite ends of a relatively high potential source having periodic relatively high voltage transients so that periodic occurrences of the voltage transients between the second cathode and the anode generate capacitive currents within the first and second layers which are manifested as a capacitive gate current in the emitter layers of the first and second cathodes. The capacitance gate current in the emitter layer of the first cathode, is unreduced in amplitude, is of a sufficient value to cause conduction between the first cathode and the anode. The high voltage semiconductor device further comprises isolation means on a top portion of the first layer in the isolation region of the collective gate region. The isolation means provides a relatively high impedance path to a current generated upon application of a signal to the first gate region and substantially prevents gate current from being conducted to the second cathode through the second gate region and the conductive element. The device further comprises a conductive ring coupled to the second gate region and to the second cathode. The isolation region provides a relatively high impedance to the transient generated capacitive currents flowing within the second gate region and the conductive ring provides a shunt path whereby a portion of the transient generated capacitive currents are diverted away from the emitter layer of the second cathode, such that the transient generated capacitive currents which are manifested as gate current are reduced, thereby improving the dv/dt capability of the device.

The features of the invention believed to be novel are set forth with particularity in the appended claims. The invention, itself, however, both as to its organization and operation, together with further objects and advantages thereof, may best be understood by reference to the following description taken in conjunction with the accompanying drawings.

DETAILED DESCRIPTION OF THE PREFERRED EMBODIMENT

Figure 1:
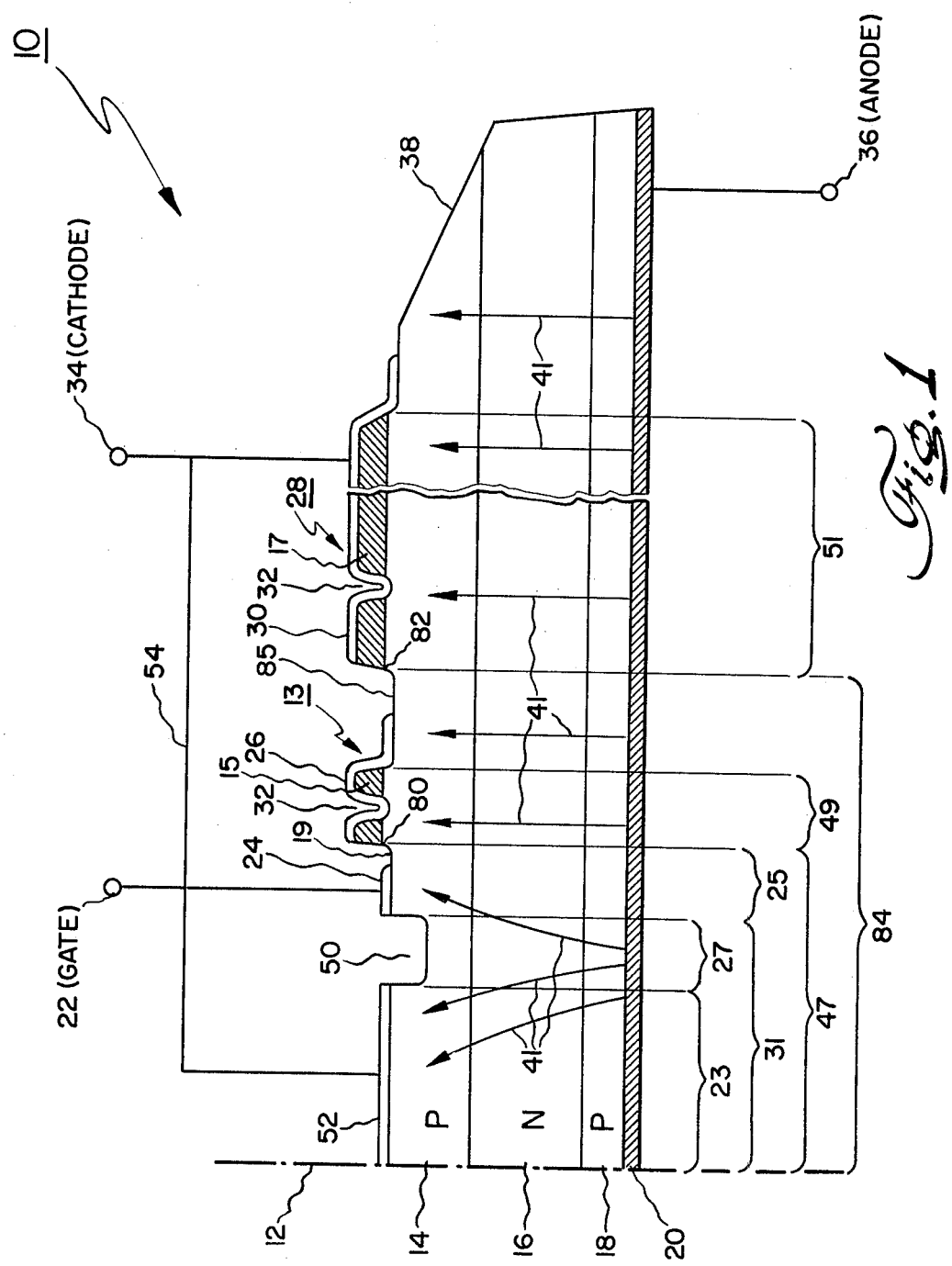
FIG. 1 is a partial cross-sectional view of a center-gated amplifying thyristor exemplifying one embodiment of the present invention.

FIG. 1 shows a partial cross-section of a semiconductor device 10 in a center-gated amplifying thyristor configuration exemplifying one embodiment of the present invention. Device 10 has an anode base layer 16 of an N-type semiconductor material and a P-type semiconductor material forming a layer 18 which is situated beneath and in contact with the layer 16. A cathode-base layer 14 of P-type semiconductor material is situated above and in contact with the layer 16. Layers 14 and 16 are shown with a beveled surface 38 located at their outer peripheries for the purpose of increasing avalanche breakdown voltage. Semiconductor layer 14 furnishes a major portion of a top surface 19 of the semiconductor device 10. Semiconductor layer 18 constitutes a substrate of the device 10. Device 10 includes a pilot thyristor 13 and a main thyristor 28 each having a highly doped n+ type layer shown respectively as 15 and as 17. The n+ layer 15 constitutes the emitter of the pilot thyristor 13. Similarly, the n+ layer 17 constitutes the emitter of the main thyristor 28. The emitter 15 is overlaid with a metallization layer 26, herein termed the pilot stage cathode electrode or first cathode electrode. Similarly, the emitter 17 is overlaid with a metallization layer 30, herein termed the main stage cathode electrode or second cathode electrode. Emitter 15 and layer 26 comprise the pilot stage cathode while emitter 17 and layer 30 comprise the main stage cathode.

Metallization layer 30 provides a contact for connecting one end of a relatively high voltage source (not shown) via terminal 34. Metallization layers 26 and 30, if desired, have conventional emitter shorts 32 formed in their top portions and extending into region 14. A further metallization layer 24 herein termed the gate of device 10, overlays cathode-base layer 14. Gate 24 may be connected to a gate signal source via terminal 22. A still further metallization layer 20, herein termed the anode of device 10, is positioned under layer 18 and provides a means for connecting the other end of the high voltage source to the device 10 via terminal 36.

Semiconductor device 10 as shown in FIG. 1, includes a collective gate region 47 extending from a centerline 12 to a leading edge of 80 of pilot thyristor 13 (which is also termed the turn-on line of pilot thyristor 13), a pilot thyristor region 49 extending from the termination of collective gate region 47 to the termination of emitter 15 of pilot thyristor 13, and a main thyristor region 51 spanning from turn-on line 82, located at the leading edge of emitter 17, to the lagging edge of emitter 17.

Collective gate region 47 is often a relatively large region having a typical dimension from centerline 12 to emitter 15 of 210 mils in a 2 inch diameter device. This region may be smaller in some designs provided steps are taken to retain a long inner periphery of the pilot thyristor emitter 15 to thereby retain suitable di/dt capability. Collective gate region 47 comprises three subregions: a first gate region 25, a second gate region 23, and an isolation region 27 which separates region 23 from region 25. Region 23 is typically the largest fraction of gate region 47, extending in this example as much as 190 mils from centerline 12. Region 25 has a typical width of 10 mils which is the difference between distance 31, having in this example a dimension of 200 mils from centerline 12, and the 210 mils extent of collective gate region 47 from centerline 12. Similarly, region 27 has a typical width of 10 mils which is the difference between the 200 mils extent of distance 31 from centerline 12 and the 190 mils extent of region 23 centerline 12. In some part of its circumference region 27 may be conveniently widened to accommodate a large gate connection thereto.

First gate region 25 has coupled onto its top surface the gate electrode 24, and functions as a gate contact region for device 10. An electrical gate signal may be coupled to gate electrode 24 via terminal 22. Device 10 may also be activated by a light source (not shown) from which radiation may impinge onto region 25, part of which may be covered by a transparent or partially transparent electrode 24. Other well known techniques may also be used to improve the photoefficiency of region 25.

Region 27 has formed into the top surface an isolation means 50 such as a groove etched into the top portion of region 27. The isolation means 50 produces a relatively high lateral impedance between regions 23 and 25, which substantially prevents the gate current, generated upon application of a gate signal onto region 25, from being conducted to region 23. Isolation means 50 may take a form other than a groove in the top surface of region 27, it being only desirable that such isolation means provide a relatively high impedance between regions 25 and 23. For example, P-base layer 14 may be formed in two sections by normal planar diffusion into an innermost section coincident with region 23 and an outer region beginning at the end of radius 31 and extending to the edge of the device 10.

The large gate area 47 is a consequence of requiring a large turn-on line 80 (i.e., large inner periphery) of the pilot thyristor emitter 15 for di/dt considerations. Region 25 and gate electrode 24 provides a means for distributing the relatively large gate currents necessary for proper initial turn-on of device 10. Turn-on line 80 is long and the gate current is large to prevent hot spots from developing with device 10, which may occur because of the relatively high turn-on currents, and thus prevents related damage to device 10. However, a large region 47 also has an inherent disadvantage in that it is a major contributor to the generation of unwanted capacitive charging currents.

As previously discussed, occurrence of voltage transients impressed across the cathode and anode of a semiconductor device, such as device 10, may cause capacitive charging currents to flow within device 10. These currents are shown in FIG. 1 as a plurality of arrows 41 emerging from anode 20 and flowing upward through layers 18, 16, and 14 towards the top portion 19 of device 10. The transient generated capacitive charging currents are commonly referred to as dv/dt currents and will be referred to as such hereinafter. A portion of the dv/dt currents 41 may be manifested as a gate current of sufficient value to exceed a critical value and render the main thyristor 28 conductive, thus inadvertently turning on device 10. Similarly, a portion of the dv/dt currents 41 may also intercept and render conductive the pilot thyristor 13, thus also inadvertently turning on device 10. Specifically, regions 23, 25 and 27 contribute the portion of capacitive charging currents 41 which act to turn on the first emitter (pilot) thyristor stage. To reduce this unwanted contribution a dv/dt guard ring 52 is placed onto region 23 to short out the portion of gate region dv/dt capacitive current contributed by region 23.

The dv/dt guard ring 52, positioned on the top surface of region 23, is connected to electrode 30 of main thyristor 28 via a conductor 54. The dv/dt guard ring 52 is typically formed of a metallization layer which, along with conductor 54, provides a shunt or parallel path to conduct a substantial portion of the transient dv/dt currents flowing within gate region 47 away from emitters 15 and 17 to cathode electrode 30 of main thyristor 28. Use of the dv/dt guard ring 52 to provide a shunt path for the dv/dt currents from second gate region 23 away from emitters 15 and 17 substantially increases the dv/dt rating of a high voltage semiconductor device without causing degradation of the other parameters of the high voltage device. Isolation means 50 in region 27 ensures that little or no dv/dt current from region 23 may appear as lateral gate current in semiconductor layer 14 at the turn-on line 80.

To a first approximation, the improvement in dv/dt capability of pilot thyristor 13 is represented as $(A_{47})/(A_{47}-A_{23})$, $A_{23}$ and $A_{47}$ being the areas of regions 23 and 47 respectively. To the same accuracy, the improvement of dv/dt capability of the main thyristor is given by $A_{84}/(A_{84}-A_{23})$ where $A_{84}$ is the area enclosed by the turn-on line 82 of the main thyristor.

Figure 2:
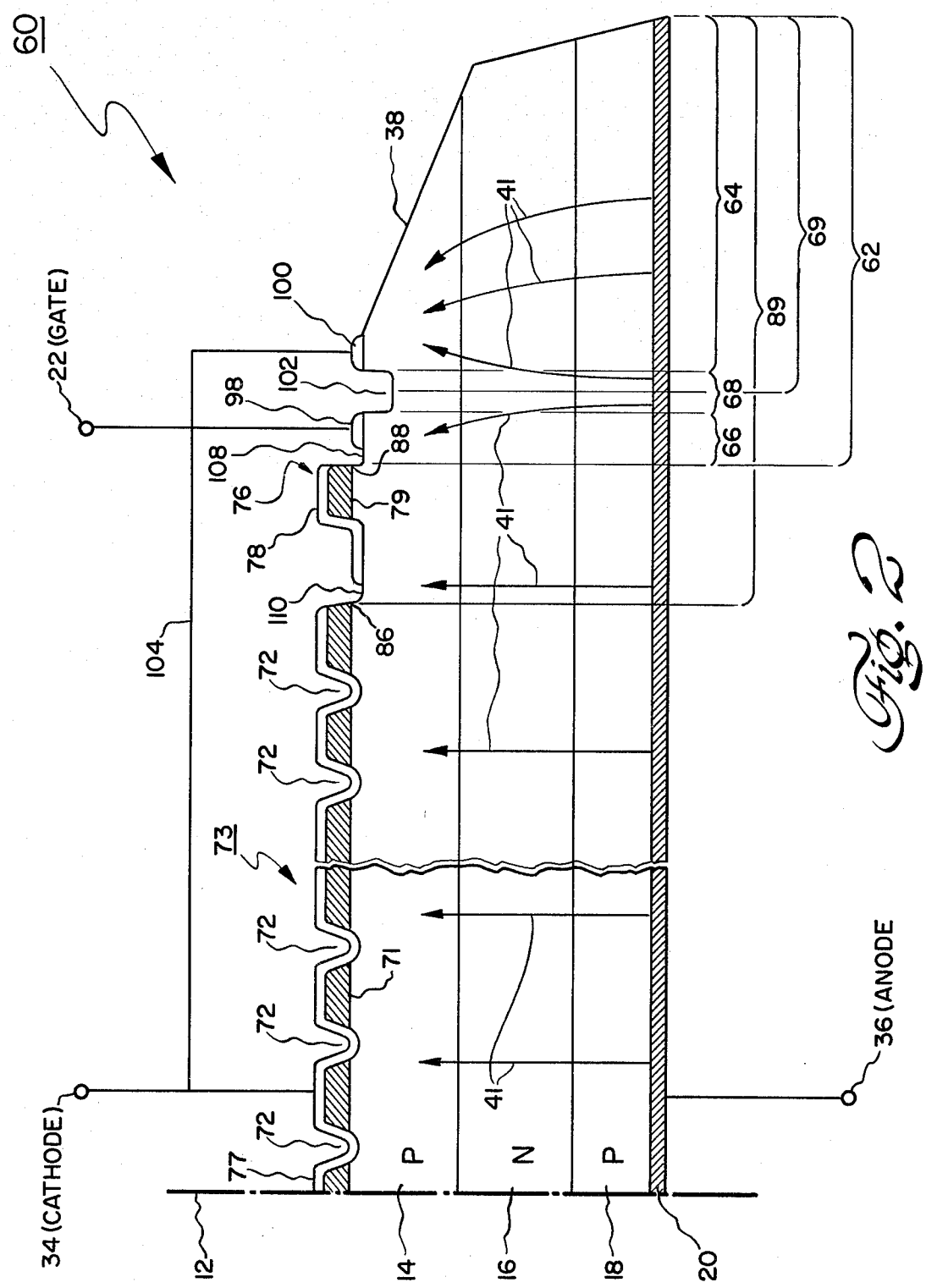
FIG. 2 is a partial cross-sectional view of an edge-gated amplifying thyristor exemplifying another embodiment of the present invention.

Another embodiment of the present invention is shown in FIG. 2, which illustrates a partial cross-sectional view of an edge-gated amplifying gate thyristor 60. Layers 14, 16 and 18, anode 20, and bevelled surface 38 are similar in structure and function as the same numbered elements shown in FIG. 1 and described for device 10, and transient dv/dt currents 41 are similar to those indicated by the same reference number in FIG. 1. Device 60 of FIG. 2 includes a pilot thyristor 76 and a main thyristor 73. Pilot thyristor 76 includes an emitter 79 formed of a high conductivity N-type material upon which is overlaid a metallization layer 78. Similarly, main thyristor 73 includes an emitter 71 formed of a high conductivity N type material upon which is overlaid a metallization layer 77. Metallization layers 78 and 77 are herein termed first (or pilot stage) cathode electrode and second (or main stage) cathode electrode, respectively. Electrode 77 includes conventional emitter shorts 72 formed in its top portion and extending into layer 14.

A metallization layer 98, forming the gate of device 60, is adapted to receive an electrical signal applied to terminal 22. Device 60 may also be activated by a light source if light radiation is directed onto the semiconductor beneath gate 98. Thus, for device 60 to constitute a light activated device, gate 98 may be a transparent or partially transparent electrode. One way in which device 60 differs from the previously described device 10 is that a collective gate region 62 is located near the edge of device 60.

Collective gate region 62 is similar to the previously described collective gate region 47 of device 10, in that it comprises a first gate region 66, a second gate region 64 and an isolation region 68 which separates regions 64 and 66.

The central portion of region 68 is shown at a distance from centerline 12 that, for example, might have a typical value of 900 mils referenced from centerline 12 in a 2 inch diameter device. Region 68 has a typical width of 10 mils. Regions 66 and 64 abut region 68 with region 66 extending inward from region 68 to a turn-on line 88 located at the leading edge of emitter 79 of pilot thyristor 76 and with region 64 extending outward from region 68 to the outer periphery of device 10. A turn-on line 86, is located at the leading edge of main thyristor emitter 71. The region external to turn-on line 86 will be herein termed region 89.

On the top surface of second gate region 64, at a location abutting the top portion of a bevelled surface 38, a dv/dt guard ring 100 coupled to second cathode electrode 77 and cathode terminal 34 by conductor 104. The top portion of region 68 has formed into its surface an isolation means 102.

The dv/dt guard ring 100 and isolating means 102 are similar to the previously described dv/dt guard ring 52 and isolation means 50, respectively, of device 10, while conductor 104 serves the same purpose as conductor 54. Similarly, second gate region 64 of collective gate region 62 is similar to the previously described second gate region 23 of collective gate region 47 of device 10. Region 62 functions in a manner similar to region 47, and exhibits a similar disadvantage. Hence, the dv/dt guard ring 100 is employed on the top portion of region 64 to short-out a major portion of the capacitive contribution of region 62 in the generation of the unwanted dv/dt currents 41 by providing a shunt or parallel path to conduct the dv/dt currents flowing in region 64 away from emitters 79 and 71 of the pilot thyristor 76 and main thyristor 73 respectively. The dv/dt currents into region 69 are shorted to second cathode electrode 77 of the main thyristor via conductor 104 and therefore are removed from the dv/dt currents which would normally be present at turn-on lines 88 and 86. Isolating means 102, prevents gate current generated by application of a gate signal to region 66 of device 60 from shorting-out to the dv/dt guard ring 100. Device 60 therefore exhibits typical dv/dt improvement factors of $A_{62}/(A_{62}-A_{69})$ for the pilot thyristor and $A_{89}/(A_{89}-A_{64})$ for the main thyristor. This is a relatively large improvement for an edge-gated amplifying thyristor.

Figure 3:
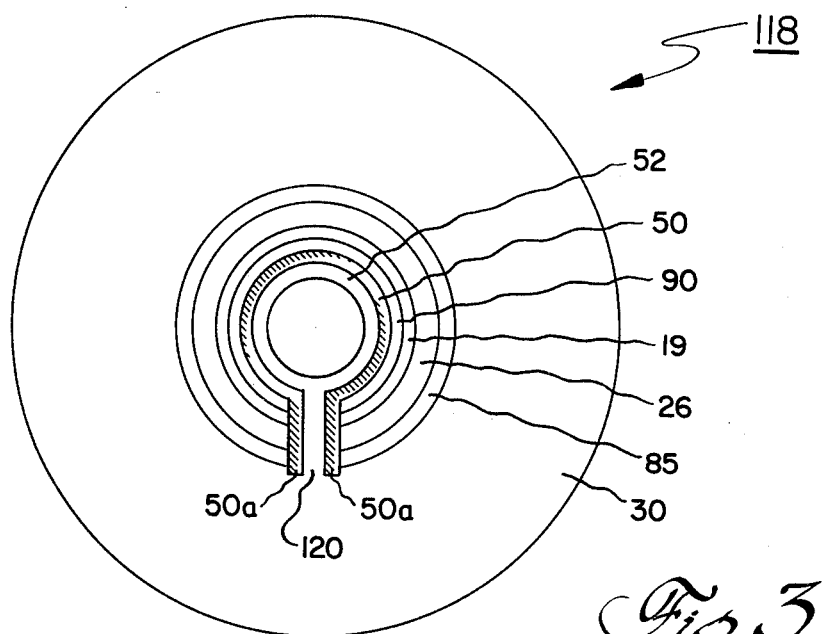
FIG. 3 is a top view of an exemplary center-gated amplifying thyristor.

A further embodiment of the present invention is shown in FIG. 3 in the form of a top view of a center-gated amplifying gate thyristor 118. The amplifying gate thyristor 118 is quite similar to the previously described device 10, wherein like reference numbers signify like components. The only substantial difference between devices 10 and 118 is that the external conductor 54 of device 10 is eliminated, the connection of dv/dt guard ring 52 to second cathode electrode 30 instead being a metallization layer common (i.e. integrally joined) to both electrode 30 and dv/dt guard ring 52. This is shown in FIG. 3 as a strip 120 formed between outwardly-directed extensions 50a of isolation means 50. Isolation means 50 is shown in FIG. 3 with a cross-hatched representation. It will be noted from FIG. 3 that isolating means 50 furnishes physical separation between the dv/dt guard ring 52 and the metallization layers 90, 26 and 30. Those skilled in the art will recognize that due to the similarity between devices 10 and 118 the dv/dt ratings of the devices are substantially equal.

Figure 4:
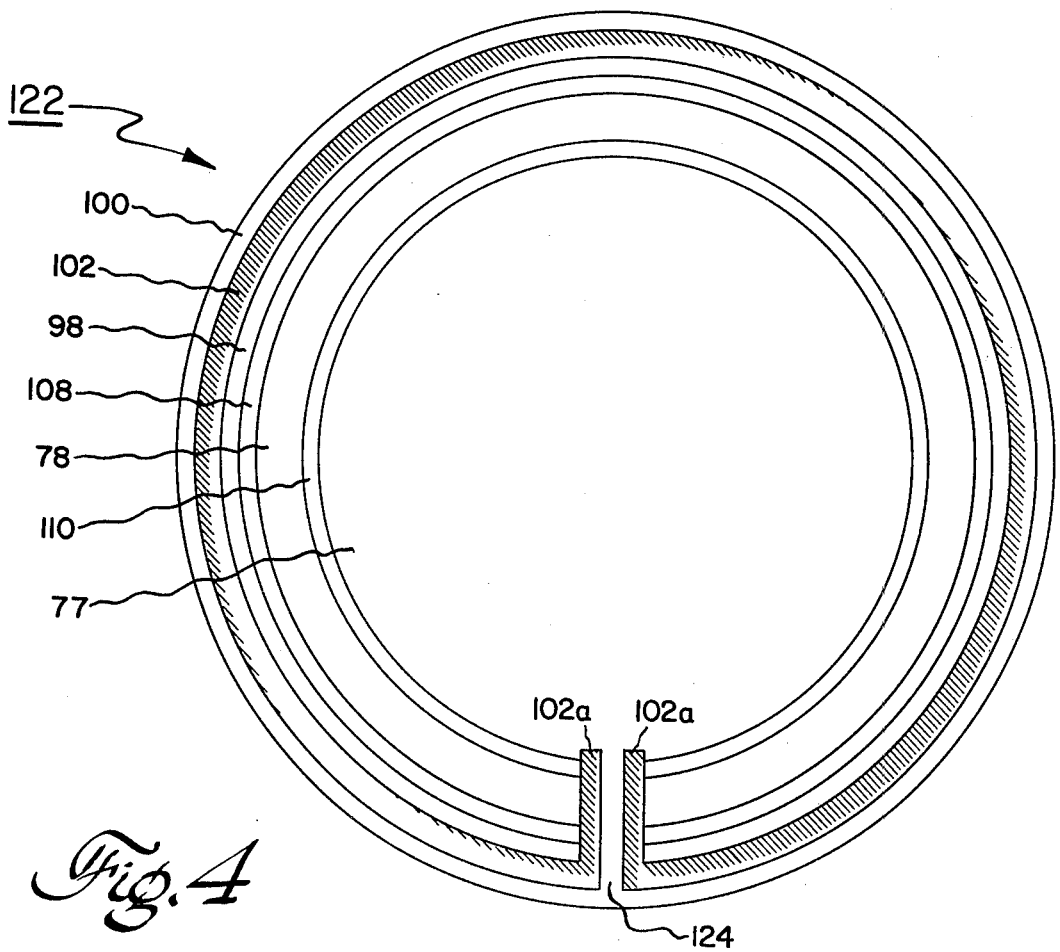
FIG. 4 is a top view of an exemplary edge-gated amplifying thyristor.

A still further embodiment of the present invention is shown in FIG. 4 in the form of a top view of an edge-gated amplifying gate thyristor 122. The amplifying gate thyristor 122 is quite similar to the previously described device 60. The only substantial difference between devices 60 and 122 is that the external conductor 104 of device 60 is eliminated, the connection of dv/dt guard ring 100 to second cathode electrode 77 instead being a metallization layer common (i.e., integrally joined) to both electrode 77 and dv/dt guard ring 100. This is shown in FIG. 4 as a strip 124 formed between outwardly-directed extensions 102a of isolation means 102. Isolation means 102 is shown in FIG. 6 with a cross-hatched representation. It will be noted from FIG. 4 that isolation means 102 furnishes a physical separation between the dv/dt guard ring 100 and the metallization layers 98, 78 and 77. Those skilled in the art will recognize that due to the similarity between devices 60 and 122 the dv/dt ratings of the devices are substantially equal.

Although amplifying gate thyristors have been described herein, it should be recognized that the described embodiments of this invention are also applicable to other simiconductor devices, such as thyristors and high voltage transistors. For a thyristor not having a pilot thyristor stage for amplifying gate current, the described embodiments need only be utilized for the main thyristor stage. Similarly, for a high voltage transistor having two layers of alternating conductivity-type material similar to layers 14 and 16 of devices 10 and 60, the described embodiments need only be utilized to divert the dv/dt current away from the emitters of the transistor.

It will now be appreciated that this invention having various embodiments, contemplates a high voltage device with improved dv/dt capability. The shunt path reduces the dv/dt currents manifested as gate current and thereby improves the dv/dt rating of the high voltage semiconductor device.

While the invention has been particularly shown and described with reference to several preferred embodiments thereof, it will be understood by those skilled in the art that various changes in form and detail may be made therein without departing from the true spirit and scope of the invention as defined by the appended claims.

What is claimed is:

1. A high voltage semiconductor device comprising: at least first and second cathodes, a collective gate region; an anode, said collective gate region adjoining said first cathode, and including a first gate region adjacent to the first cathode and adapted to receive an applied signal, a second gate region and an isolation region separating the first gate region and the first cathode; a conductive element coupling said second gate region to said second cathode, each of said first and second cathodes, respectively, having an emitter layer affixed beneath an electrode, respectively, and being separated from said anode by a plurality of layers of alternating conductivity-type material; said second cathode being coupled to said conductive element by first of said layers, said second cathode and said anode being adapted to be coupled between opposite ends of a relatively high voltage potential source having periodic relatively high voltage transients so that periodic occurrences of the voltage transients between said second cathode and said anode generate capacitive charging currents within said first layer and a second of said layers which are manifested as capacitive gate current in the emitter layers of said first and second cathodes; isolation means located on a top portion of the first layer in said isolation region of said collective gate region, said isolation means providing a relatively high impedance path to a current generated upon application of a signal to said first gate region of the gate region and substantially preventing gate current from being conducted to the second cathode through said second gate region and said conductive element; and a conductive ring coupled to said second gate region and to said second cathode, said isolating region providing a relatively high impedance to the transient generated capacitive charging currents flowing within said second gate region, said conductive ring providing a shunt path for transient generated capacitive charging currents flowing within said second gate region, whereby a portion of the transient generated capacitive currents are diverted away from the emitter layer of said second cathode such that the transient generated capacitive charging currents which are manifested as gate current are reduced, thereby improving the dv/dt capability of said device.

2. The high voltage semiconductor device according to claim 1 wherein said plurality of layers of alternating conductivity-type material further includes a third layer, so that periodic occurrences of voltage transients between said second cathode and said anode generate capacitive charging currents within said first, second and third layers which are manifested as a gate current applied to the emitter layers of said first and second cathodes.

3. The high voltage semiconductor device according to claim 2 wherein said first cathode is located between said second cathode and said collective gate region so that the periodic voltage transients between said second cathode and said anode generate capacitive charging currents within the third layer as well as said first and second layers, said charging currents being manifested as gate current in the emitter layers of said first and second cathodes, said conductive ring providing a shunt path for diverting a portion of the transient generated capacitive charging currents flowing with said second gate region away from the emitter layers of said first and second cathodes such that the transient generated capacitive charging currents which are manifested as gate current in the emitter layers of the first and second cathodes are reduced, thereby improving the dv/dt capability of said device.

4. The high voltage semiconductor device according to claims 1, 2 or 3 wherein the collective gate region includes an electrode on said first layer transparent to incident radiation of a suitable frequency whereby gate current is generated by said incident radiation impinging on said first gate region through said electrode.

5. The high voltage semiconductor device according to claim 1 wherein said conductive ring is situated within a periphery bounded by said isolation means.

6. The high voltage semiconductor device according to claim 1 wherein said conductive ring is situated outside a periphery defined by said isolation means.

7. The high voltage semiconductor device according to claims 1, 2, 3, 5 or 6 wherein said conductive ring is coupled to said second cathode through a metallization layer integrally joined at one end to the conductive ring and at the other end to said second cathode.

* * * * *

UNITED STATES PATENT AND TRADEMARK OFFICE
CERTIFICATE OF CORRECTION

PATENT NO. : 4,261,000
DATED : April 7, 1981
INVENTOR(S) : Victor A. K. Temple

It is certified that error appears in the above—identified patent and that said Letters Patent is hereby corrected as shown below:

Claim 1, Column 7, line 68, after "cathode" insert -- from the second gate region --.

Signed and Sealed this

Fifteenth Day of June 1982

[SEAL]

Attest:

GERALD J. MOSSINGHOFF

Attesting Officer

Commissioner of Patents and Trademarks